US006404264B2

(12) United States Patent
Daniel et al.

(10) Patent No.: US 6,404,264 B2
(45) Date of Patent: *Jun. 11, 2002

(54) FUSE LATCH HAVING MULTIPLEXERS WITH REDUCED SIZES AND LOWER POWER CONSUMPTION

(75) Inventors: Gabriel Daniel, Jamaica Estates; Toshiaki Kirihata, Poughkeepsie, both of NY (US)

(73) Assignees: Infineon Technologies North America Corp., San Jose, CA (US); International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/455,118

(22) Filed: Dec. 6, 1999

(51) Int. Cl.[7] .............................................. H03K 17/62

(52) U.S. Cl. ....................................... 327/407; 327/408

(58) Field of Search ................................. 327/407, 408, 327/525, 333, 198, 200, 201, 208–210; 326/105, 106, 107, 108, 95, 96, 97, 98

(56) References Cited

U.S. PATENT DOCUMENTS

| 5,600,277 A | * | 2/1997 | Koelling ...................... 327/526 |
| 5,646,558 A | * | 7/1997 | Jamshidi ....................... 326/106 |
| 5,808,944 A | * | 9/1998 | Yoshitake et al. ........... 365/200 |
| 5,848,003 A | * | 12/1998 | Nishikawa .................... 365/200 |
| 5,983,013 A | * | 11/1999 | Rogers et al. ................. 326/96 |
| 6,052,008 A | * | 4/2000 | Chu et al. ..................... 327/200 |

* cited by examiner

Primary Examiner—Tuan T. Lam
(74) Attorney, Agent, or Firm—Stanton Braden

(57) ABSTRACT

A fuse latch for a memory circuit according to the present invention comprises a plurality of address lines, a control signal line provided from a fuse, a multiplexer for multiplexing the plurality of address lines in response to the control signal wherein the multiplexer has only one type transistors, and a decoder for receiving a multiplexed signal from the multiplexer. Since the multiplexer has a smaller size than that of a conventional CMOS multiplexer, a fuse latch circuit of the present invention has a smaller size than that of a conventional fuse latch. The multiplexer preferably has only NMOS transistors. To overcome a voltage drop due to an NMOS threshold voltage, the present invention uses low-threshold NMOSs and/or boosts the transistors in the multiplexer. Alternatively, the voltage drop is successfully converted into a CMOS level by using a dynamic logic circuit. Further, current consumption of a fuse latch circuit of the present invention is reduced by adopting NMOS transistors to which a lower voltage level may be applied.

24 Claims, 4 Drawing Sheets

US 6,404,264 B2

FUSE LATCH HAVING MULTIPLEXERS WITH REDUCED SIZES AND LOWER POWER CONSUMPTION

FIELD OF THE INVENTION

The present invention relates to a fuse latch for a memory circuit, and more particularly to multiplexer employed within the fuse latch having a reduced size and reduced current consumption.

BACKGROUND OF THE INVENTION

In manufacturing high volume, low margin products, like memory chips, manufacturing cost and performance of the products are important factors to be considered. There have been efforts in the manufacturing industry of memory chips to reduce the manufacturing cost of memory chips, while maintaining or improving their performance. One of the factors determining the manufacturing cost is a size of a memory chip, that is, typically, the smaller a size of a memory chip, the lower the manufacturing cost of the memory chip.

One of the components having an effect on a size of a memory chip is fuse latches in the memory chip. Generally, a memory chip has a significant number of fuse latches. For example, there are about 30,000 fuse latches in a typical memory chip of 1 G-bit SDRAM (synchronous dynamic random access memory). Thus, a size of the fuse latch is one factor in determining the size of a memory chip.

Referring to FIG. 1, a conventional fuse latch is illustrated for a memory circuit. A conventional fuse latch has a complementary metal oxide semiconductor (CMOS) multiplexer receiving input address data ADD and ADD' and a latch control signal CONT. The input address data ADD and ADD' have a certain level (i.e., CMOS level) of voltage, and the latch control signal CONT is dependent on a status of a (not shown) of the fuse latch. The CMOS multiplexer 10 includes, for example, a first CMOS transistor 12 and a second CMOS transistor 14. The CMOS multiplexer 10 also has a latch input terminal 16 through which the control signal CONT is provided to the first and second CMOS transistors 12 and 14, and a latch output terminal 18 for generating a multiplexed signal to a decoder 19. The first CMOS transistor 12 receives true address data ADD and the second CMOS transistor 14 receives complement address data ADD'. The control signal CONT is provided to the first CMOS transistor 12 through an inverter 17 and to the second CMOS transistor 14 to enable/disable the first and second CMOS transistors 12 and 14 depending on the status of the fuse. The CMOS multiplexer 10 multiplexes the true and the complement address data ADD and ADD' in response to the control signal CONT. In other words, depending on whether the fuse has been blown or is intact, either true address data ADD or complement address data ADD' propagates through the CMOS multiplexer 10 to the decoder 19.

Referring to FIG. 2, a cross-sectional view of a typical CMOS transistor used in a conventional fuse latch in FIG. 1 is illustrated. A typical CMOS transistor 20 has a serial combination of a p-channel transistor 22 and an n-channel transistor 24. A typical CMOS transistor 20 uses a dopant which is diffused into the surface of substrate 26 to form, for example, an n-well 28 as well as drain and source regions of the p-channel transistor 22 and the n-channel transistor 24. Since the diffusion of the dopant occupies some space to form the n-well 28, the p-channel transistor 22 is larger than the n-channel transistor 24. In a conventional fuse latch (referring to FIG. 1), the size of p-channel transistors is, for example, nearly twice the size of n-channel transistors. Thus, a CMOS multiplexer including the p-channel transistors contributes to an increase in the size of a conventional fuse latch, or a memory chip.

Accordingly, a need exists for a fuse latch having a reduced size, thereby reducing the size of a memory chip.

SUMMARY OF THE INVENTION

The present invention relates to a fuse latch circuit having a reduced size and a reduced current consumption. A fuse latch of the present invention includes a plurality of address lines, an input terminal for receiving a control signal varying dependent on status of a fuse, a multiplexer having single type transistors for multiplexing the plurality of address lines in response to the control signal, and an output terminal for providing a multiplexed signal from the multiplexer to a decoder. All the transistors of the multiplexer may be either only n-channel metal oxide semiconductor (NMOS) transistors or only p-channel metal oxide semiconductor (PMOS) transistors. The decoder may be a dynamic decoder for eliminating a voltage drop due to threshold voltages of the transistors. In case of NMOS transistors, the dynamic decoder may include an NMOS logic circuit having a NMOS transistor enabled in response to the multiplexed signal from the multiplexer. In case of PMOS transistors, the dynamic decoder may include a PMOS logic circuit having a PMOS transistor enabled in response to the multiplexed signal.

The plurality of address lines may be applied with address signals with a voltage lower than a source voltage of the decoder. The address lines may include, for example, a first address line for providing true address data and a second address line for providing complement address data. The multiplexer may have, for example, a first transistor for receiving the true address data and a second transistor for receiving the complement address data. The first and second transistors may be enabled or disabled in response to the control signal, and share either a drain region or a source region.

For eliminating the voltage drop, the fuse latch may include a voltage supply unit for providing a boost voltage to the first and the second transistors. The voltage supply unit may be connected to a wordline boost voltage supply for a wordline driver, where the fuse latch is used for a decoupling capacitance of the wordline boost voltage. The boost voltage may be equal to or higher than a source voltage provided to the decoder, preferably, is equal to a sum of the source voltage provided to the decoder and a threshold voltage of the transistors in the multiplexer. The fuse latch may further include a first inverter for inverting the control signal and a second inverter for inverting an output signal of the first inverter and for providing an inverted signal to the input terminal. The first inverter may be coupled between the input terminal and the first transistor and may receive the boost voltage from the voltage supply unit. The second inverter may be coupled between the output of the first inverter and the input terminal and also receive the boost voltage from the voltage supply unit.

The size of a multiplexer having single type transistors, preferably only n-channel transistors, may be substantially smaller than that of a conventional multiplexer having CMOS transistors. The multiplexer may include only NMOS transistors which also reduces the current consumption.

These and other objects, features and advantages of the present invention will become apparent from the following detailed description of illustrative embodiments thereof, which is to be read in connection with the accompanying drawings.

BRIEF DESCRIPTION OF THE DRAWINGS

This disclosure will present in detail the following description of preferred embodiments with reference to the following figures wherein.

DESCRIPTION OF PREFERRED EMBODIMENTS

The present invention relates to fuse latches in memory chips. Since memory chip sizes are one factor having an effect on manufacturing cost of memory chips, it is desirable to reduce memory chip sizes. Reduction in a size of a memory chip may be accomplished by reducing a size of fuse latches in a memory chip. In a way to reduce the size of fuse latches may include reducing a size of multiplexers in the fuse latches.

Figure 3:
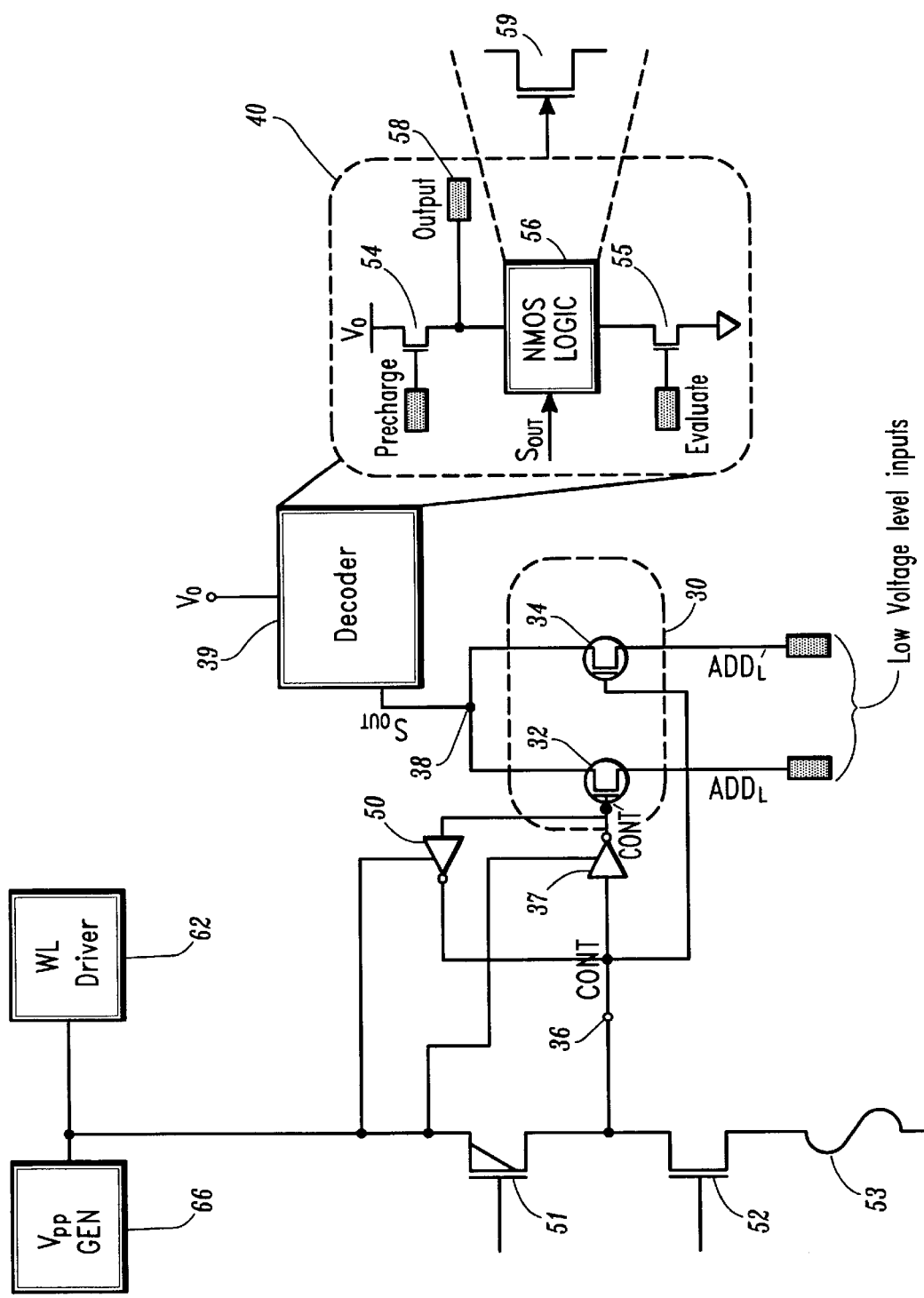
FIG. 3 is a schematic diagram of one embodiment of a fuse latch according to the present invention.

FIG. 3 shows one embodiment of a fuse latch according to the present invention. A fuse latch of the present invention includes an n-channel metal oxide semiconductor (NMOS) multiplexer 30 which has, for example, a first NMOS transistor 32 and a second NMOS transistor 34. The first NMOS transistor 32 receives true address data $ADD_L$, and the second NMOS transistor 34 receives complement address data $ADD_L'$. A latch control signal CONT is provided to the NMOS multiplexer 30 through a latch input terminal 36. The latch control signal CONT is dependent on a status of a fuse 53. The NMOS multiplexer 30 multiplexes the true address data $ADD_L$ and the complement address data $ADD_L'$ in response to the control signal CONT, and generates a multiplexed output signal Sour to a decoder 39 though a latch output terminal 38.

In the NMOS multiplexer 30, the first and the second NMOS transistors 32 and 34 are coupled to each other in parallel. The first NMOS transistor 32 has a conduction path with a source receiving the true address data $ADD_L$ and a drain connecting to the latch output terminal 38. The first NMOS transistor 32 also has a gate connecting to the latch input terminal 36 via a first inverter 37, and controls the true address data $ADD_L$ provided to the conduction path in response to the inverted control signal CONT' provided to the gate. The second NMOS transistor 34 has a conduction path with a source receiving the complement address data $ADD_L'$ and a drain connecting to the latch output terminal 38, and a gate connecting to the latch input terminal 36. The second NMOS transistor 34 controls the complement address data $ADD_L'$ provided to the conduction path in response to the control signal CONT provided to the gate. Thus, the first and the second NMOS transistors 32 and 34 multiplex the true address data $ADD_L$ and the complement address data $ADD_L'$ in response to the control signal CONT.

During a fuse latch initialization phase, the control signal CONT is determined depending on a condition (i.e., blown or unblown) of the fuse 53. The latch input terminal 36 is precharged by enabling a PMOS transistor 51 while disabling a third NMOS transistor 52. The PMOS transistor 51 is then disabled, and the third NMOS transistor 52 is periodically turned on. Thus, the control signal CONT is discharged (i.e., ground) when the fuse 53 is not blown, and maintains 'high' if the fuse 53 is blown. A second inverter 50 keeps the state of the control signal CONT as it is.

Referring to FIG. 3, when the fuse 53 is not blown, the control signal CONT discharging 'low' is provided to the NMOS multiplexer 30. The first NMOS transistor 32 then receives the inverted control signal CONT' (i.e., 'high' signal) via the inverter 37, and the second NMOS transistor 34 receives the control signal CONT (i.e., 'low' signal). Since the second NMOS transistor 34 is turned off by applying the 'low' signal to the gate, the complement address data $ADD_L'$ is not transferred to the latch output terminal 38. On the contrary, the first NMOS transistor 32 is turned on by applying the 'high' signal to the gate, so that the true address data $ADD_L$ is transferred to the latch output terminal 38. On the other hand, when the fuse 53 is blown so that the control signal CONT maintains 'high', the first and the second NMOS transistors 32 and 34 receive the inverted control signal CONT' (i.e., 'low' signal) via the inverter 37 and the control signal CONT (i.e., 'high' signal), respectively. Thus, the second NMOS transistor 34 is turned on so that the complement address data $ADD_L'$ is transferred to the latch output terminal 38, and the first NMOS transistor 32 is turned off so that the true address data $ADD_L$ is not transferred to the latch output terminal 38.

Therefore, the NMOS multiplexer 30 multiplexes the address data $ADD_L$ and $ADD_L'$ in such a way that the true address data $ADD_L$ is selected and transferred to the decoder 39 when the fuse 53 is not blown, and that the complement address data $ADD_L'$ is selected and transferred to the decoder 39 when the fuse 53 is blown.

In case of the NMOS multiplexer 30 having only NMOS transistors, the NMOS multiplexer causes a voltage drop due to threshold voltages of the NMOS transistors. Referring to FIG. 3, in a fuse latch of the present invention, a high supply voltage $V_H$ may be applied to boost the input nodes of the NMOS multiplexer 30. That is, the first and second NMOS transistors 32 and 34 are coupled to the high supply voltage $V_H$ via the first and second inverters 37 and 50, respectively. The high supply voltage $V_H$ is equal to or larger than a source voltage $V_O$ applied to the decoder 39 by at least the threshold voltage of the NMOS transistors 32 and 34. The high supply voltage $V_H$ may be provided by a wordline boost voltage ($V_{PP}$) generator 66 outside the fuse latch connected to a wordline driver 62. By coupling a source of the fuse latch to a node of the wordline boost voltage $V_{PP}$, the fuse latch acts as a huge decoupling capacitor for minimizing a noise of the node of the wordline boost voltage $V_{PP}$. Thus, there is no need of any additional decoupling capacitor for the node. The high supply voltage $V_H$ is equal to or higher than the sum of the source voltage $V_O$ and the threshold voltage $V_T$ of the NMOS transistors 32 and 34, i.e., $V_H \geq V_O + V_T$.

When the fuse latch uses a non-boosted voltage, i.e., the source voltage $V_O$, a dynamic decoder 40 is preferably used for the decoder 39 to accept the voltage drop of the latch output terminal 38. Referring to FIG. 3, a preferred embodiment of a dynamic decoder 40 is shown for accepting a voltage drop due to the threshold voltages of the NMOS transistors 32 and 34. The dynamic decoder 40 precharges an output terminal 58 by turning on a PMOS transistor 54 with a precharge signal while disabling an NMOS transistor 55 with an evaluation signal. That is, at a precharge stage the dynamic decoder 40 outputs the source voltage $V_O$. An NMOS logic circuit 56 is coupled between the evaluation NMOS transistor 55 and the output terminal 58 and receives the multiplexed output signal $S_{OUT}$ from the NMOS multiplexer 30. An example of the NMOS logic circuit 56 may be an NMOS transistor 59. The NMOS transistor 59 has a gate receiving the multiplexed output signal $S_{OUT}$ and a conduction path coupling the evaluation NMOS transistor 55 and the output terminal 58.

Since the multiplexed signal $S_{OUT}$ has a voltage drop by the amount of the threshold voltage of the NMOS transistors 32 and 34, a conventional static logic circuit (not shown) causes a leakage current if an input voltage of the logic (here, the multiplexed signal $S_{OUT}$) is smaller than a voltage applied to a source of a PMOS in the static logic circuit. However, the NMOS logic circuit 56 of the dynamic decoder 40 does not cause a leakage current as long as the evaluation NMOS transistor 55 is off The output terminal 58 is precharged at the source voltage $V_O$ (i.e., 'high'), and then the evaluation NMOS transistor 55 is periodically on, allowing a determination of the state of the output according to the result of the NMOS logic 56. As an example of the NMOS logic 56, when the multiplexed signal $S_{OUT}$ is 'high', the output terminal 58 generates a 'low' signal. When the multiplexed signal $S_{OUT}$ is 'low', the output terminal 58 maintains 'high' signal (i.e., the source voltage $V_O$).

Figure 5A:
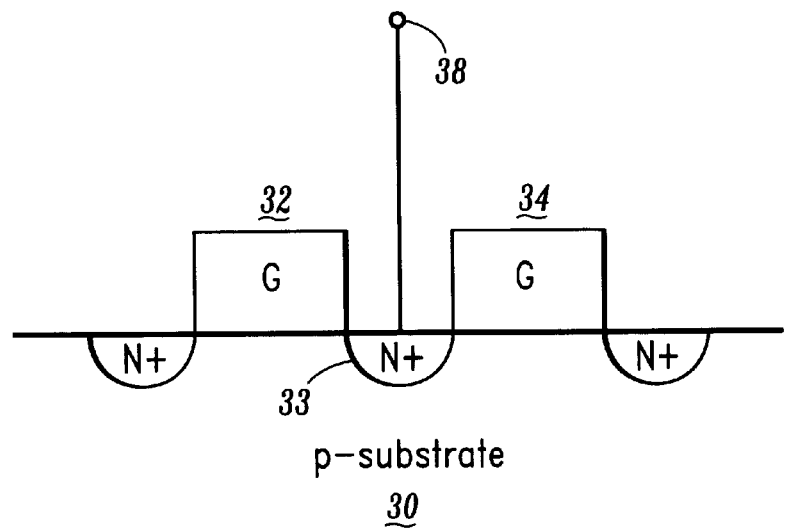
FIG. 5A is a cross-sectional view of an NMOS multiplexer used in the embodiment shown in FIG. 3 according to the present invention.

FIG. 5A illustrates a cross-sectional view of the NMOS multiplexer 30 in FIG. 3. Since the NMOS multiplexer 30 has only NMOS transistors 32 and 34 instead of CMOS transistors, the NMOS multiplexer 30 does not need p-well dopant implantation. Thus, the NMOS multiplexer 30 has substantially smaller size than a CMOS multiplexer used in a conventional fuse latch by at least about 50% per multiplexer. In addition, the two NMOS transistors 32 and 34 of the NMOS multiplexer 30 preferably share a drain region 33, so that the size of the NMOS multiplexer 30 may be further reduced. It is also possible that the two NMOS transistors 32 and 34 share a source region instead of the drain region 33.

Figure 1:
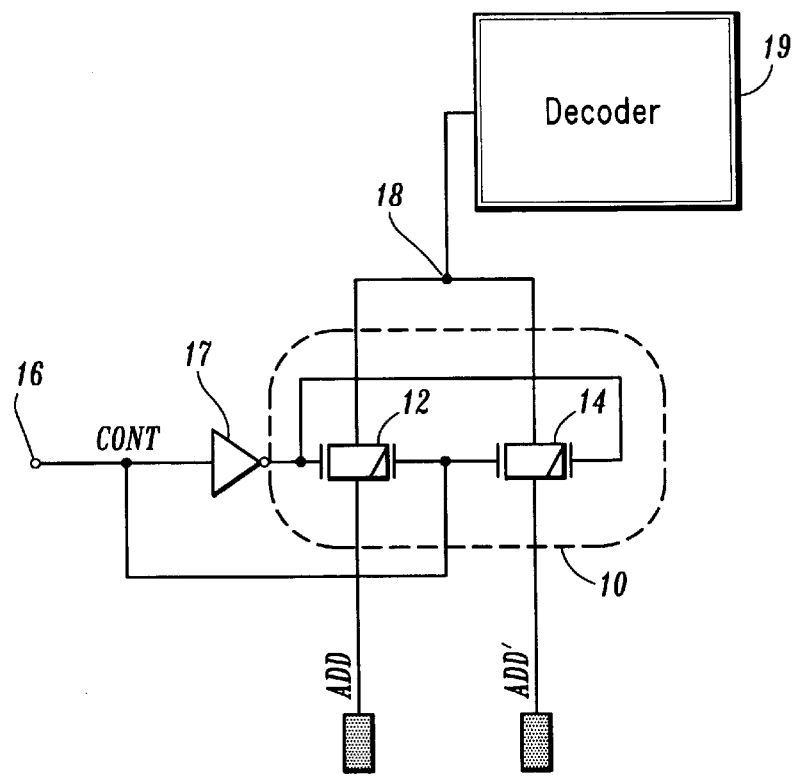
FIG. 1 is a schematic diagram illustrating a conventional fuse latch including a CMOS multiplexer.
Figure 2:
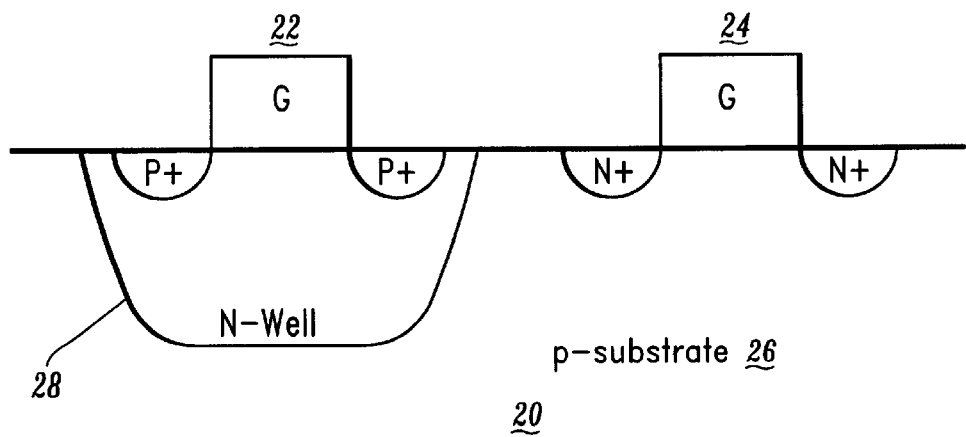
FIG. 2 is a cross-sectional view of a typical CMOS transistor used in a conventional CMOS multiplexer.

The NMOS multiplexer 30 of the present invention also has lower power consumption than that of a conventional CMOS multiplexer if a lower voltage signaling is used. More specifically, the true and the complement address data $ADD_L$ and $ADD_L'$ provided to the NMOS multiplexer 30 may have a lower voltage level than that of the address data ADD and ADD' provided to a CMOS multiplexer (referring to FIG. 1) of a conventional fuse latch. Thus, the current consumption in the NMOS multiplexer 30 may be reduced by the reduction of the voltage swing of the address data ADD and ADD'. Although the lower voltage level is preferably used for the address data of the NMOS multiplexer 30 to enjoy the benefit of lower power consumption, the same voltage level as used for the address data of a CMOS multiplexer may still be used in the present invention.

Figure 4:
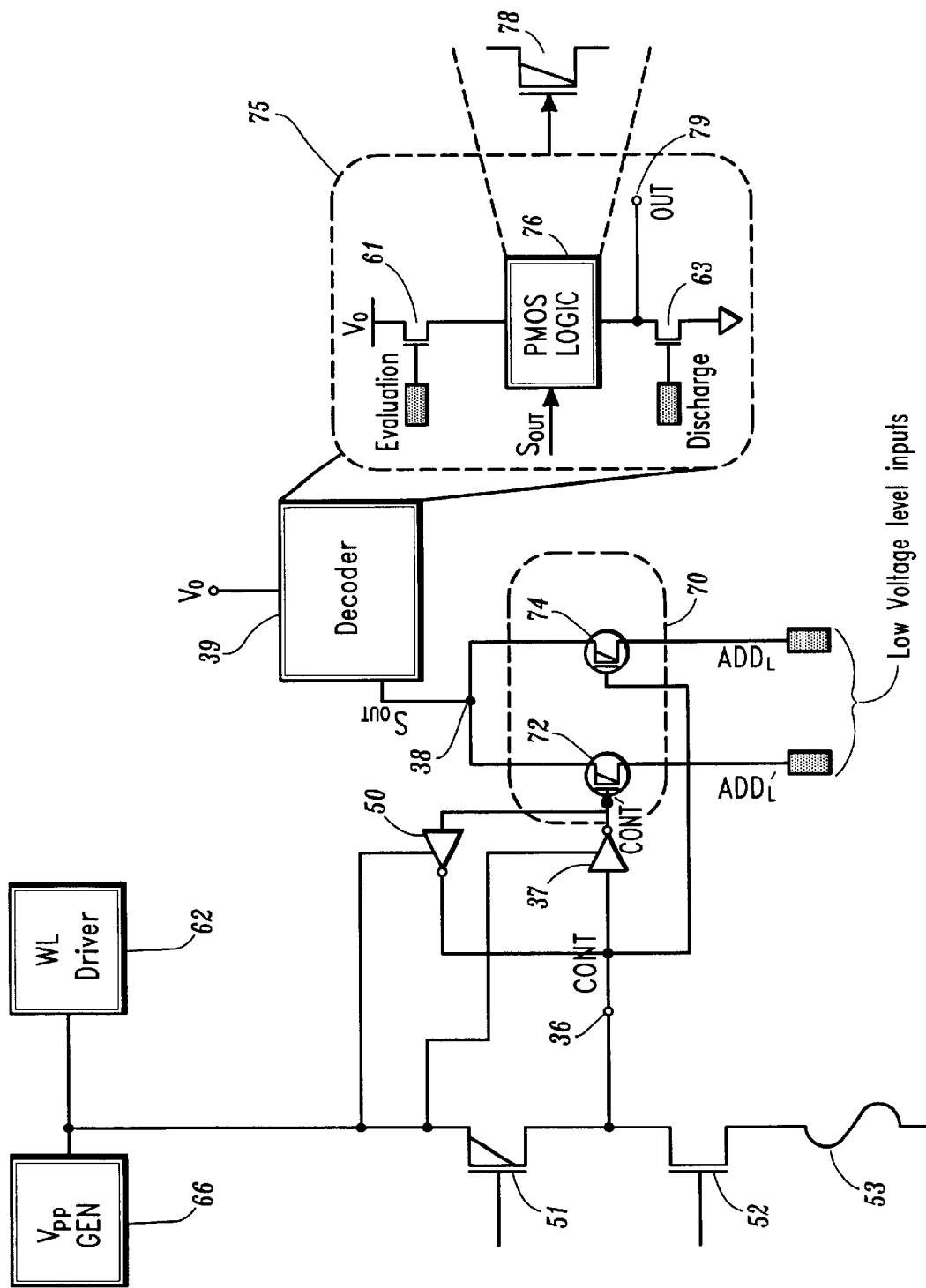
FIG. 4 is a schematic diagram of another embodiment of a fuse latch according to the present invention.

Referring to FIG. 4, there is provided another embodiment of a fuse latch of the present invention using a PMOS multiplexer 70 having only PMOS transistors 72 and 74. Parts equivalent to those in FIG. 3 are represented with like reference numbers and description thereof is omitted to avoid duplication. The PMOS multiplexer 70 includes a first PMOS transistor 72 and a second PMOS transistor 74 which, unlike the NMOS multiplexer 30 in FIG. 3, receives the complement address data $ADD_L'$ and the true address data $ADD_L$, respectively. The PMOS multiplexer 70 multiplexes the address data $ADD_L'$ and $ADD_L$ in response to the latch control signal CONT and generates the multiplexed output signal $S_{OUT}$ to the decoder 39.

For the same reasons mentioned above, the decoder 39 may be a dynamic decoder 75. The dynamic decoder 75 includes a PMOS logic circuit 76 between an evaluation NMOS transistor 61 and a PMOS transistor 63. The PMOS logic circuit 76 may be a PMOS transistor 78 having a gate receiving the multiplexed output signal $S_{OUT}$ from the PMOS multiplexer 70 and a conduction path coupling the evaluation transistor 61 and an output terminal 79. The output terminal 79 is initially discharged. When the evaluation transistor 61 is off, signals from the output terminal 79 follow states of the PMOS logic circuit 76.

Figure 5B:
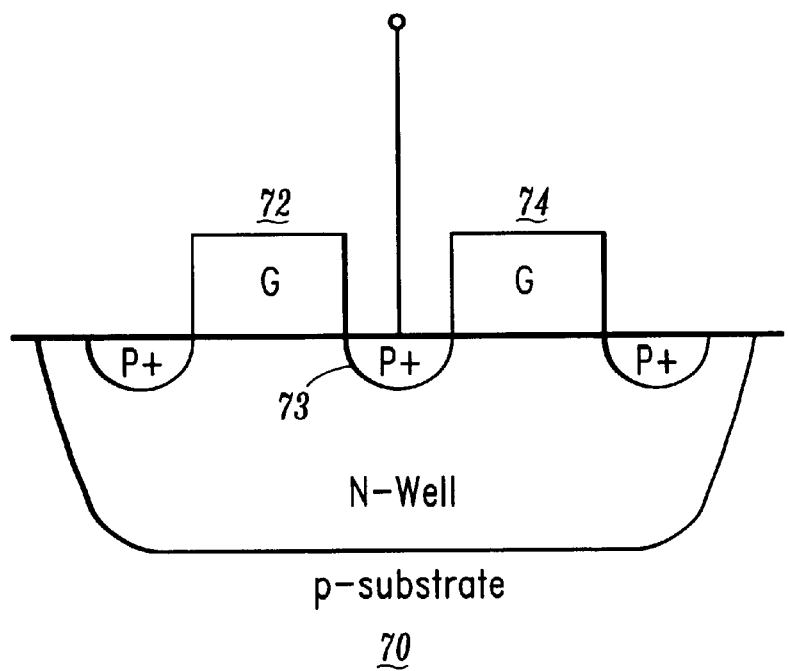
FIG. 5B is a cross-sectional view of a PMOS multiplexer used in the embodiment shown in FIG. 4 according to the present invention

Referring to FIG. 5B, a cross-sectional view of the PMOS multiplexer 70 in FIG. 4 is shown. Compared with a CMOS multiplexer used in a conventional fuse latch, the PMOS multiplexer 70 has substantially smaller size because the first and the second PMOS transistors 72 and 74 share a drain region 73. Although not shown, the two PMOS transistors may also share a source region instead of the drain region 73.

Therefore, the reduction of a memory chip size may be accomplished by using a fuse latch of the present invention of which size is reduced by adopting the NMOS multiplexer or the PMOS multiplexer instead of a conventional CMOS multiplexer by as large as 50% per multiplexer. Current consumption of driving address in a memory chip is also reduced by using a fuse latch of the present invention to which the address data with a lower voltage signaling of the address data ADD and ADD' is applied. Optionally, the gates of the NMOS transistors of the NMOS multiplexer are boosted by the threshold voltage to avoid a voltage drop.

It is understood that various other modifications can be readily made by those skilled in the art without departing from the scope and spirit of the present invention. For example, although having been described in terms of an NMOS multiplexer 30 having two NMOS transistors 32 and 34, the present invention is applicable to an NMOS multiplexer having more than two NMOS transistors, and also applicable to a PMOS multiplexer having more than two PMOS transistors.

Numerous modifications and variations of the present invention are possible in light of the above teachings. It is therefore to be understood that, within the scope of the appended claims, the present invention can be practiced in a manner other than as specifically described herein.

What is claimed is:

1. A fuse latch circuit comprising:

a plurality of address lines;

an input terminal for receiving a control signal from a fuse;

a multiplexer for multiplexing the plurality of address lines in response to the control signal, wherein the multiplexer has transistors each being associated with each of the address lines, and all the transistors of the multiplexer are a single transistor type;

an output terminal for providing a multiplexed signal from the multiplexer to a decoder; and a voltage supply unit for boosting the control signal, wherein the voltage supply unit is connected to the fuse through a means for precharging the input terminal, wherein the voltage supply unit provides a high voltage to boost the control signal provided to the multiplexer, wherein the nigh voltage is equal to or higher than a sum of a source voltage provided to the decoder and a threshold voltage of the transistors, wherein the transistors share a drain or a source region.

2. The fuse latch circuit as defined in claim 1, wherein all the transistors of the multiplexer are n-channel metal oxide semiconductor (NMOS) transistors.

3. The fuse latch circuit as defined in claim 2, wherein the decoder is a dynamic decoder including an NMOS logic circuit.

4. The fuse latch circuit as defined in claim 3, wherein the NMOS logic circuit includes a NMOS transistor enabled in response to a multiplexed output signal from the multiplexer.

5. The fuse latch circuit as defined in claim 1, wherein all the transistors of the multiplexer are p-channel metal oxide semiconductor (PMOS) transistors.

6. The fuse latch circuit as defined in claim 5, wherein the decoder is a dynamic decoder including a PMOS logic circuit.

7. The fuse latch circuit as defined in claim 6, wherein the PMOS logic circuit includes a PMOS transistor enabled in response to a multiplexed output signal from the multiplexer.

8. The fuse latch circuit as defined in claim 1, wherein the plurality of address lines includes:
a first address line for providing true address data; and
a second address line for providing complement address data.

9. The fuse latch circuit as defined in claim 8, wherein the multiplexer includes:
a first transistor for receiving the true address data; and
a second transistor for receiving the complement address data,
wherein the first and the second transistors are a single transistor type and are enabled or disabled in response to the control signal.

10. The fuse latch circuit as defined in claim 1, wherein the voltage supply unit is connected to a wordline boost voltage supply for a wordline driver.

11. The fuse latch circuit as defined in claim 10, wherein the fuse latch circuit is connected to an output of the wordline boost voltage supply for generating a boost voltage to the wordline driver, the fuse latch circuit for acting as a decoupling capacitor to reduce noise at the output of the wordline boost voltage supply.

12. The fuse latch circuit as defined in claim 9, further comprising a first inverter for inverting the control signal, wherein the first inverter is coupled between the input terminal and the first transistor and receives the boost voltage from the voltage supply unit.

13. The fuse latch circuit as defined in claim 12, further including a second inverter for inverting an output signal of the first inverter and for providing an inverted signal to the input terminal, wherein the second inverter is coupled between the output of the first inverter and the input terminal and receives the boost voltage from the voltage supply unit.

14. The fuse latch circuit as defined in claim 1, wherein the control signal is dependent on status of the fuse.

15. The fuse latch circuit as defined in claim 1, wherein the decoder is a dynamic decoder for eliminating a voltage drop due to threshold voltages of the transistors.

16. The fuse latch circuit as defined in claim 1, wherein the plurality of address lines are applied with address signals with a voltage lower than a source voltage of the decoder.

17. The fuse latch circuit as defined in claim 1, wherein each of the transistors of the multiplexer has a source-drain conduction path between one of the plurality of address lines and the output terminal, and a gate for receiving the control signal.

18. A fuse latch circuit comprising:
a first address line for providing true address data;
a second address line for providing complement address data;
an input terminal for receiving a control signal varying dependent on status of a fuse;
a multiplexer for multiplexing the first and the second address lines in response to the control signal, wherein the multiplexer has a first transistor for receiving the true address data and a second transistor for receiving the complement address data, the first and the second transistors being a single transistor type and being enabled or disabled in response to the control signal; and
a dynamic decoder connected to an output of the multiplexer, for eliminating a voltage drop due to the first and the second transistors in response to a multiplexed signal from the output of the multiplexer, wherein the dynamic decoder includes a logic circuit having only transistors of the same type as the first and the second transistors in the multiplexer,
wherein the first and second transistors share a drain or a source region.

19. The fuse latch circuit as defined in claim 18, wherein the first and the second transistors are NMOS transistors and the logic circuit has transistors of only NMOS type.

20. The fuse latch circuit as defined in claim 18, wherein the first and the second transistors are PMOS transistors and the logic circuit has transistors of only PMOS type.

21. A fuse latch circuit comprising:
a first address line for providing true address data;
a second address line for providing complement address data;
an input terminal for receiving a control signal varying dependent on status of a fuse;
a multiplexer for multiplexing the first and the second address lines in response to the control signal, wherein the multiplexer has a first transistor for receiving the true address data and a second transistor for receiving the complement address data, the first and the second transistors being a single transistor type and being enabled or disabled in response to the control signal; and
a voltage supply unit for providing a predetermined high voltage to boost the control signal provided to the multiplexer, wherein the voltage supply unit is connected to the fuse through a means for precharging the input terminal, wherein the voltage supply unit includes:
a first inverter for providing the first transistor with a first control signal boosted in response to the predetermined high voltage; and
a second inverter for providing the second transistor with a second control signal boosted in response to the predetermined high voltage,
wherein the first and the second control signals have respective logic values opposite to each other.

22. The fuse latch circuit as defined in claim 21, wherein the voltage supply unit is connected to a wordline driver.

23. The fuse latch circuit as defined in claim 21, wherein the predetermined high voltage is equal to or higher than a sum of a source voltage provided to a decoder for decoding an output of the multiplexer and a threshold voltage of the first and second transistors.

24. A fuse latch circuit comprising:

a plurality of address lines;

an input terminal for receiving a control signal from a fuse;

a multiplexer for multiplexing the plurality of address lines in response to the control signal, wherein the multiplexer has transistors each being associated with each of the address lines, and all the transistors of the multiplexer are a single transistor type;

an output terminal for providing a multiplexed signal from the multiplexer to a decoder; and a voltage supply unit for boosting the control signal, wherein the voltage supply unit is connected to the fuse through a means for precharging the input terminal, wherein the plurality of address lines includes:
  a first address line for providing true address data; and
  a second address line for providing complement address data, wherein the multiplexer includes:
  a first transistor for receiving the true address data; and
  a second transistor for receiving the complement address data, wherein the first and the second transistors are a single transistor type and are enabled or disabled in response to the control signal;

wherein the fuse latch circuit further comprises:
  a first inverter for inverting the control signal, wherein the first inverter is coupled between the input terminal and the first transistor and receives a boost voltage from the voltage supply unit; and
  a second inverter for inverting an output signal of the first inverter and for providing an inverted signal to the input terminal, wherein the second inverter is coupled between the output of the first inverter and the input terminal and receives the boost voltage from the voltage supply unit.

* * * * *